United States Patent

Lederman

[11] Patent Number: 6,108,166
[45] Date of Patent: Aug. 22, 2000

[54] CURRENT-PINNED SPIN VALVE SENSOR

[75] Inventor: Marcos M. Lederman, San Francisco, Calif.

[73] Assignee: Read-Rite Corporation, Milpitas, Calif.

[21] Appl. No.: 09/038,919

[22] Filed: Mar. 12, 1998

[51] Int. Cl.[7] .................................................. G11B 5/39
[52] U.S. Cl. .............................................................. 360/113
[58] Field of Search .................................... 360/113, 125; 338/32 R; 324/252; 428/611

[56] References Cited

U.S. PATENT DOCUMENTS

| | | | |
|---|---|---|---|
| 5,508,867 | 4/1996 | Cain et al. | 360/113 |
| 5,583,725 | 12/1996 | Coffey et al. | 360/113 |
| 5,598,308 | 1/1997 | Dieney et al. . | |
| 5,627,704 | 5/1997 | Lederman et al. . | |
| 5,635,835 | 6/1997 | Mouchot et al. | 324/252 |
| 5,650,887 | 7/1997 | Dovek et al. . | |
| 5,666,248 | 9/1997 | Gill | 360/113 |
| 5,677,625 | 10/1997 | Dieny . | |
| 5,796,561 | 8/1998 | Mauri | 360/113 |

OTHER PUBLICATIONS

T. Zhu et al., Motorola, Abstract EA11, Intermag 1997.

*Primary Examiner*—William J. Klimowicz
*Attorney, Agent, or Firm*—Nathan N. Kallman

[57] ABSTRACT

A current-pinned spin valve sensor includes a soft ferromagnetic free layer having a first thickness, a soft ferromagnetic pinned layer having a second thickness less than the first thickness, a copper layer sandwiched between the free and the pinned layer, and a current source coupled to the free layer, pinned layer, and copper layer to provide a biasing current that generates a magnetic field of sufficient strength to saturate the pinned layer. Preferably, the free layer and pinned layer selected from a group of materials consisting of essentially Permalloy, Cobalt, Iron-Cobalt, and soft Cobalt-based ferromagnetic alloys. Also preferably the free layer has an Mrt of at least 0.3 memu/cm$^2$ and the pinned layer has a Mrt of at most 0.28 memu/cm$^2$, and such that the ratio of the Mrt of the free layer to the Mrt of the pinned layer is in the range of 2–10. The biasing current through the sensor is preferably at least 4 mA. The biasing current creates a magnetic field which creates the proper magnetization in the pinned layer without the need for an antiferromagnetic (AFM) layer in contact with the pinned layer.

20 Claims, 4 Drawing Sheets

CURRENT-PINNED SPIN VALVE SENSOR

BACKGROUND OF THE INVENTION

This invention relates generally to magnetic disk drives, more particularly to spin valve—magnetoresistive (MR) thin film read heads, and most particularly to methods and structures for providing a pinning mechanism for spin valve sensors.

Magnetic disk drives are used to store and retrieve data for digital electronic apparatus such as computers. In FIGS. 1A and 1B, a magnetic disk drive D of the prior art includes a sealed enclosure 1, a disk drive motor 2, a magnetic disk 3, supported for rotation by a spindle S1 of motor 2, an actuator 4 and an arm 5 attached to a spindle S2 of actuator 4. A suspension 6 is coupled at one end to the arm 5, and at its other end to a read/write head or transducer 7. The transducer 7 is typically an inductive write element with a sensor read element. As the motor 2 rotates the disk 3, as indicated by the arrow R, an air bearing is formed under the transducer 7 to lift it slightly off of the surface of the disk 3. Various magnetic "tracks" of information can be read from the magnetic disk 3 as the actuator 4 is caused to pivot in a short arc as indicate by the arrows P. The design and manufacture of magnetic disk drives is well known to those skilled in the art.

The most common type of sensor used in the transducers 7 is the magnetoresistive sensor. A magnetoresistive (MR) sensor is used to detect magnetic field signals by means of a changing resistance in a read element. A conventional MR sensor utilizes the anisotropic magnetoresistive (AMR) effect for such detection, where the read element resistance varies in proportion to the square of the cosine of the angle between the magnetization in the read element and the direction of a sense current flowing through the read element. When there is relative motion between the MR sensor and a magnetic medium (such as a disk surface), a magnetic field from the medium causes a change in the direction of magnetization in the read element, thereby causing a corresponding change in resistance of the read element. The change in resistance can be detected to recover the recorded data on the magnetic medium.

Another form of magnetoresistance is known as spin valve magnetoresistance (SVMR). In a spin valve sensor, two ferromagnetic layers are separated by a copper layer. One of the ferromagnetic layers is a "free" layer and the other ferromagnetic layer is a "pinned" layer. In the prior art, this pinning has typically been achieved with an exchanged-coupled anti-ferromagnetic layer deposited adjacent to the pinned layer.

More particularly, and with reference to FIG. 1C, a shielded, single-element magnetoresistive head (MRH) 10 includes a first shield 12, a second shield 14, and a spin valve sensor 16 disposed within a gap (G) between shields 12 and 14. An air bearing surface S is defined by the MRH 10. The spin valve sensor is preferably centered in the gap G to avoid self-biasing effects. Lines of magnetic flux impinging upon the spin valve sensor create a detectable change in resistance. The design and manufacture of magnetoresistive heads, such as MRH 10, are well know to those skilled in the art.

In FIG. 2 a cross-sectional view taken along line 2—2 of FIG. 1 (i.e. from the direction of the air bearing surface S) illustrates the structure of the spin valve sensor 16 of the prior art. The spin valve sensor 16 includes a free layer 18, a copper layer 20, a pinned layer 22, and anti-ferromagnetic (AFM) layer 24. The spin valve sensor 16 is supported by a substrate 17 and a buffer layer 19. Ferromagnetic end regions 21 abut the ends of the spin valve sensor 16. Leads 25, typically made from gold or another low resistance material, bring the current to the spin valve sensor 16. A capping layer 27 is provided over the AFM layer 24. A current source 29 provides a current $I_b$ to flow through the various layers of the sensor 16, and signal detection circuitry 31 detects changes in resistance of the sensor 16 as it encounters magnetic fields.

The free and pinned layers are typically made from a soft ferromagnetic material such as Permalloy. As is well known to those skilled in the art, Permalloy is a magnetic material nominally including 81% nickel (Ni) and 19% iron (Fe). The layer 20 is copper. The AFM layer 24 is used to set the magnetic direction of the pinned layer 22, as will be discussed in greater detail below.

The purpose of the pinned layer 22 will be discussed with reference to FIGS. 3A and 3B. In FIG. 3A, the free layer 18 can have a magnetization direction as illustrated by the arrow 26, while the pinned layer 22 is magnetized as indicated by the arrow 28. Absent the magnetostatic coupling of the pinned layer 22, the ferromagnetic exchange coupling through the copper layer 20, and absent the field generated by the sensing current $I_S$, the free layer 18 may have a magnetization as indicated by the dashed arrow 30. The actual magnetic angle 26 is the sum of the magnetic angle 30 and the magnetostatic coupling of the pinned layer 22, the ferromagnetic exchange coupling though the copper layer 20, and the field generated by the sensing current $I_S$.

As seen in FIG. 3B on the curve R vrs. H, the magnetization 28 of the pinned layer 22 at a right angle to the magnetization 30 of the free layer 18 biases the free element to a point 32 on the curve that is relatively linear, and which has a relatively large slope. Linearity is, of course, desirable to provide a linear response, and the relatively large slope is desirable in that it produces large resistance changes in response to the changes in the magnetic field.

The anti-ferromagnetic material of the AFM layer 24 is either a manganese (Mn) alloy such as Iron-Manganese (FeMn) or an oxide such as Nickel-Oxide (NiO). The AFM layer 24 prevents the magnetization of the pinned layer 22 from rotating under most operating conditions, with the result that only the magnetic moment of the free layer 18 can rotate in the presence of an external magnetic field.

The SVMR sensor that has the most linear response and the widest dynamic range is one in which the magnetization of the pinned ferromagnetic layer 22 is parallel to the signal field and the magnetization of the free layer 18 is perpendicular to the signal field. However, the use of the AFM layer 24 to pin the pinned layer 22 presents several problems. For one, the exchange field strength generated by the AFM is highly sensitive to temperature. As the temperature increases, the AFM "softens" and its ability to fix the magnetization of the pinned ferromagnetic layer decreases. In consequence, SVMR sensors are highly sensitive to electrostatic discharge (ESD) currents and the resultant heating of the AFM 24. Further, AFM materials such as Fe-Mn are much more susceptible to corrosion than the other materials used in the SVMR sensor. The sensitivity of the AFM materials requires careful control of the fabrication process steps and the use of the protective materials for SVMR. AFM films 24 are also difficult to manufacture, in that they may require high annealing temperatures to be in the proper crystallographic antiferromagnetic phase.

SUMMARY OF THE INVENTION

The present invention eliminates the need for the anti-ferromagnetic (AFM) layer in a spin valve sensor. This is accomplished by providing correctly configured free and pinned layers, and by providing a biasing current through the sensor that creates a magnetic field strong enough to induce an appropriate magnetic field in the pinned layer.

A current-pinned spin valve sensor in accordance with the present invention includes a soft ferromagnetic free layer having a first thickness, a soft ferromagnetic pinned layer having a second thickness that is less than the first thickness, a copper layer sandwiched between the free layer and the pinned layer, and a current source coupled to the sensor layers to provide a biasing current that generates a magnetic field of sufficient strength to saturate the pinned layer without losing much linear range. Preferably, the free layer and the pinned layer are selected from a group of materials consisting essentially of Permalloy, Cobalt, CoFe, and soft Cobalt-alloy ferromagnetic materials. Also preferably, the free layer has a Mrt of at least 0.3 memu/cm$^2$ and the pinned layer has Mrt of at most 0.28 memu/cm$^2$, where Mrt is the product of the remnant magnetization (Mr) and the thickness (t) of the film, and where that the ratio of the Mrt of the free layer to the Mrt of the pinned layer is preferably in the range of 2–10. Also preferably, the biasing current is at least 4 milliamperes (mA).

A method for pinning a pinned layer of a spin valve sensor in accordance with the present invention includes providing a spin valve sensor having a soft ferromagnetic free layer of a first thickness, a soft ferromagnetic pinned layer of a second thickness that is less than the first thickness, and a copper layer sandwiched between the free layer and pinned layer. The method further includes the passing of a biasing current through the sensor to generate a magnetic field of sufficient strength to saturate the pinned layer. As before, the free layer preferably has a Mrt of at least 0.3 memu/cm$^2$ and the pinned layer has a Mrt of at most 0.28 memu/cm$^2$, and preferably the ratio of the Mrt of the free layer to the Mrt of the pinned layer is in the range of 2–10 The biasing current is preferably at least 4 mA.

The configuration of the pinned and free layers, and the magnitude of the biasing current, result in a correctly magnetized pinned layer. Therefore, the need for an anti-ferromagnetic (AFM) layer to fix the magnetization of the pinned layer has been eliminated in the present invention. This greatly reduces the manufacturing complexities, reduces the temperature and ESD sensitivity of the sensor, and increases the reliability of the sensor.

These and other advantages of the present invention will become apparent to those skilled in the art upon a reading of the following descriptions of the invention and a study of the several figures of the drawing.

DETAILED DESCRIPTION OF THE PREFERRED EMBODIMENTS

Figure 1A:
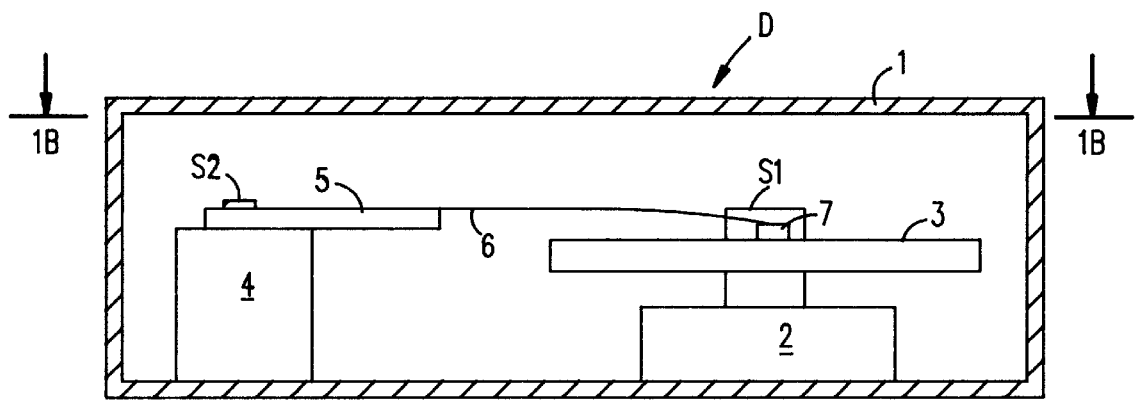
FIG. 1A is a partially sectioned, front elevational view of a magnetic disk drive assembly.
Figure 1B:
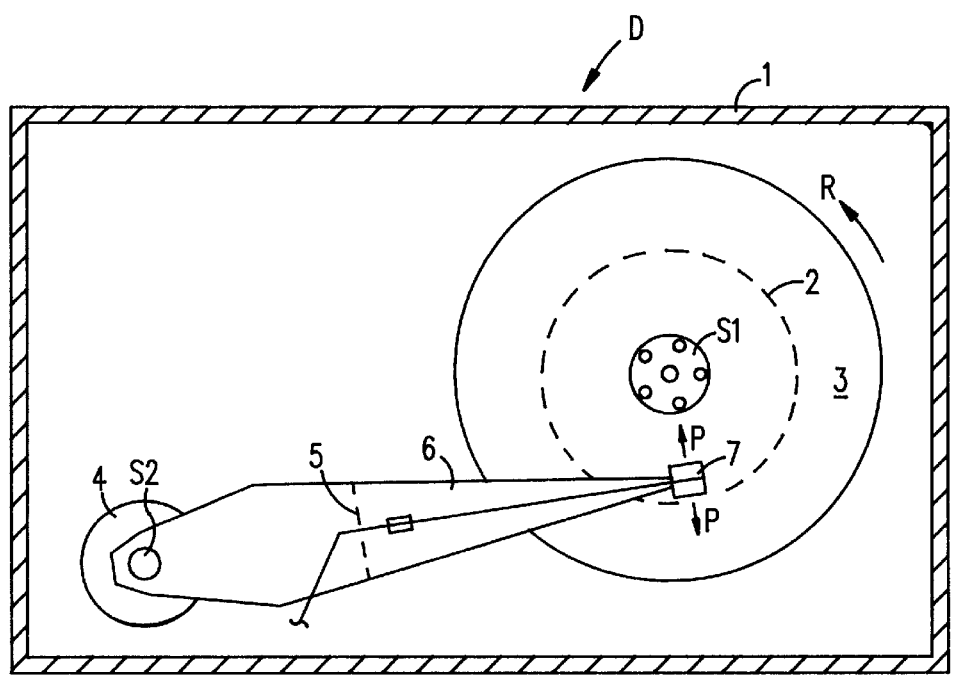
FIG. 1B is a cross section taken along line 1B—1B of FIG. 1A.
Figure 1C:
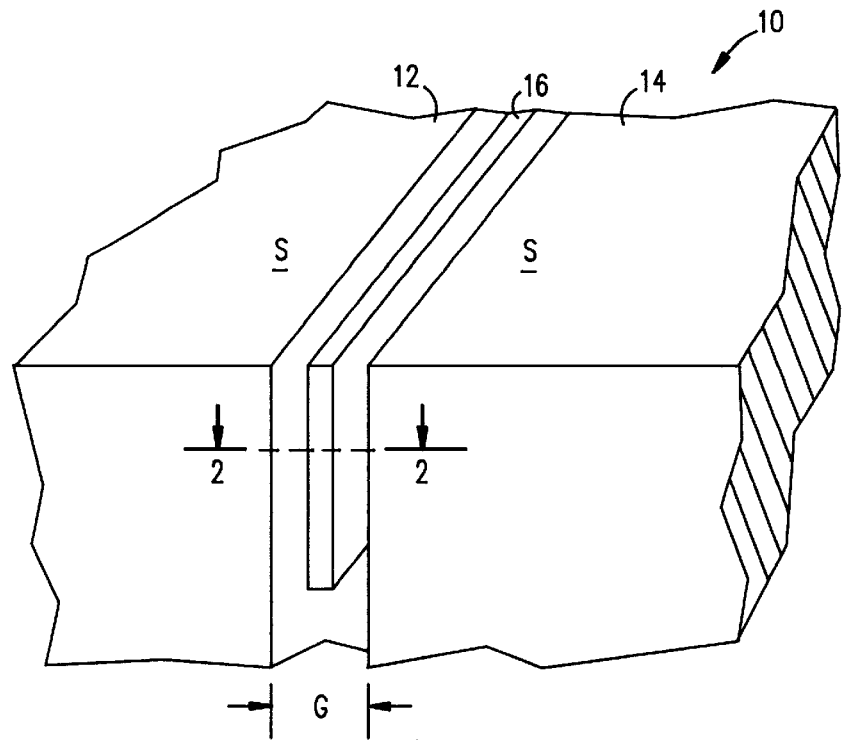
FIG. 1C is a perspective view of a prior art shielded vertical magnetoresistive spin valve sensor head.
Figure 2:
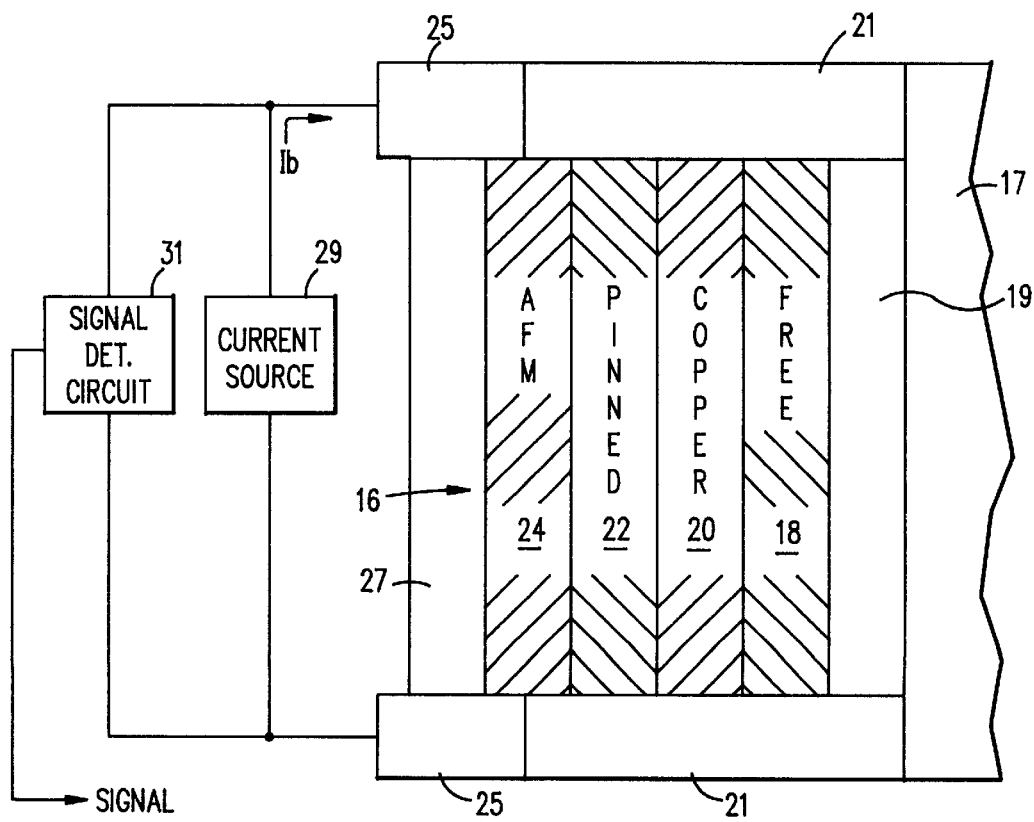
FIG. 2 is a cross-sectional view of the spin valve sensor and associated substrates, support structures, and circuitry taken along line 2—2 of FIG. 1C.
Figure 3A:
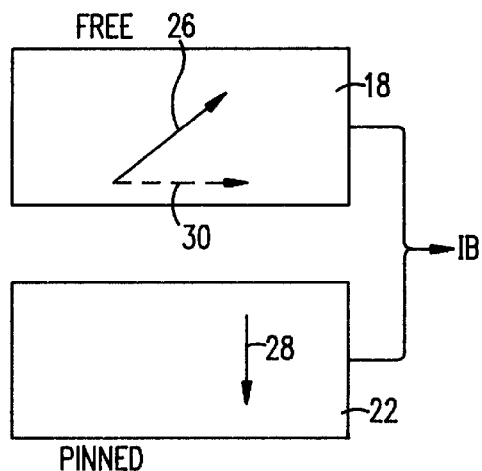
FIG. 3A illustrates the magnetic moment direction of the free and pinned layers of the spin valve sensor of FIG. 2.
Figure 3B:
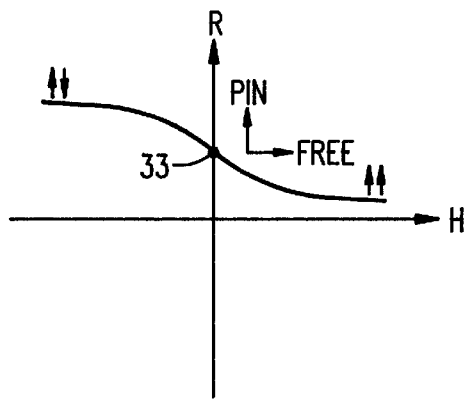
FIG. 3B is a graph illustrating the resistance versus magnetic field relationship of the spin valve sensor.
Figure 4:
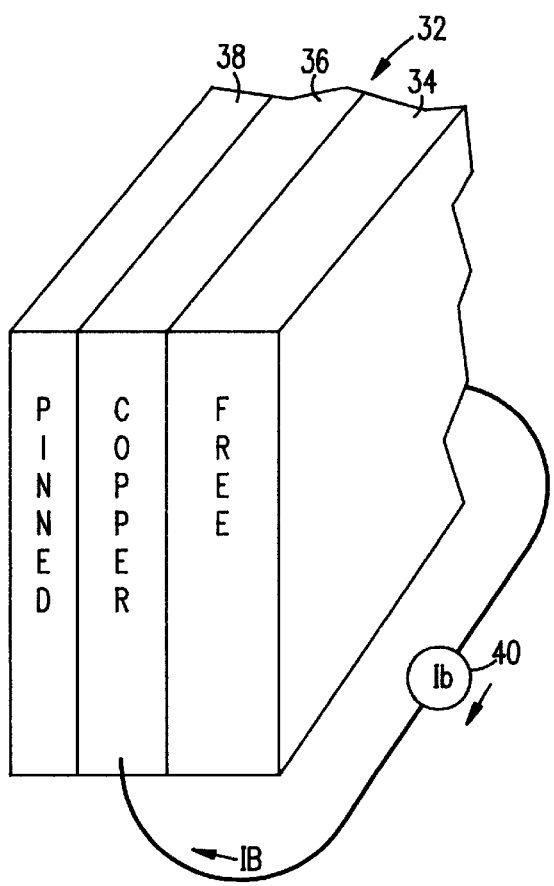
FIG. 4 is a perspective view of an spin valve sensor of the present invention.

FIGS. 1, 2, 3A, and 3B were discussed with reference to the prior art. In FIG. 4, a spin valve sensor 32 of the present invention includes a free layer 34, a copper layer 36, and a pinned layer 38. It should be noted, unlike the prior art, there is no anti-ferromagnetic (AFM) layer adjacent to the pinned layer 38. The proper magnetization of the pinned layer is induced by a magnetic field generated by a biasing current $I_b$ flowing through layers of sensor 32. The biasing current is generated by a current source 40. This current flow creates a magnetic field that ensures the magnetization of the pinned layer 38 is saturated in a direction perpendicular to the current flow.

The material of the free layer 34 and the pinned layer 38 is preferably a soft ferromagnetic material. Most preferably, the soft magnetic material is the well known Permalloy magnetic material which nominally 81% nickel and 19% iron. Other materials suitable for the free layer 34 and the pinned layer 38 include Cobalt (Co), Iron-Cobalt (CoFe), and other soft Cobalt alloy ferromagnets. As is well known to those skilled in the art, a "soft" ferromagnetic material has low coercivity, e.g. less than 15 Oersteds. Layer 36 is copper and is used as an interlayer or "spacer" between the free layer 34 and the pinned layer 38, i.e. the copper layer 36 is "sandwiched" between the free layer 34 and the pinned layer 38. Methods and apparatus for creating the various layers 34, 36, and 38 are well known to those skilled in the art of spin valve sensors.

Figure 5:
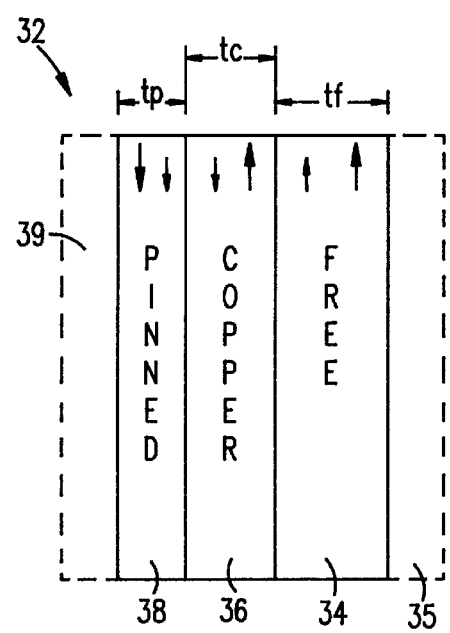
FIG. 5 is an end view of the spin valve sensor of FIG. 4.

FIG. 5 is an end view of the spin valve sensor 32 of FIG. 4. It is noted that the thickness' of the layers are different and are not to scale. The thickness $t_f$ of the free layer 34 is preferably in the range of 40 to 100 Angstroms. The thickness of copper layer 35 $t_c$ is preferably in the range of 20 to 35 Angstroms. The thickness $t_p$ of the pinned layer 38 is preferably in the range of 10 to 35 Angstroms. The Mrt product ratio of the free to pinned layers should be in the range of 2–10, and more preferably in the range of 2–5.

Also seen in FIG. 5 are field profiles of the three layers caused by the current $I_b$ flowing through the layers of the sensor 16. When current $I_b$ of sufficient magnitude flows through the sensor 16, the pinned layer 38 saturates in a direction transverse to the current flow. Therefore, the current should be high enough to result in the saturation of the pinned layer, but not so high as to bias the sensor 16 from its linear range. In the currently described embodiment, this effect occurs at biasing currents greater than about 5 mA, and more preferably at least 6 or 7 mA. However, in embodiments of this invention with thinner layers and, therefore, lower Mrts, the effect will occur at lower biasing currents, e.g. 4 mA.

To achieve this effect, it is important that the pinned layer 38 have a small Mrt (i.e. a small saturation field) with respect to that of the free layer 34. Preferably, the pinned layer has a very small Mrt of approximately 0.1–0.28 memu/cm$^2$, and the free layer has a much larger Mrt, e.g. an Mrt of 0.3–0.5 memu/cm$^2$ or greater. Most preferably, the ratio of the Mrt of the free layer to the Mrt of the pinned layer is in the range of 2–5.

In preferred embodiments of the present invention, the spin valve sensor 32 includes a buffer layer 35 abutting the free layer 34, and a capping layer 39 abutting the pinned layer 38. The buffer layer 35 serves the same purpose as the buffer layer 19 of the prior art (see FIG. 2), and the capping layer 39 serves the same purpose as the capping layer 27 of the prior art (also see FIG. 2). Preferably, the buffer layer 35 is made from either tantalum or zirconium. Likewise preferably, the capping layer 39 is made from either tantalum or zirconium.

Experimental results provides data useful in determining the Mrt and biasing current ranges. This experimental data was derived using a traditional spin valve sensor having a AFM layer adjacent to the pinning layer.

Figure 6A:
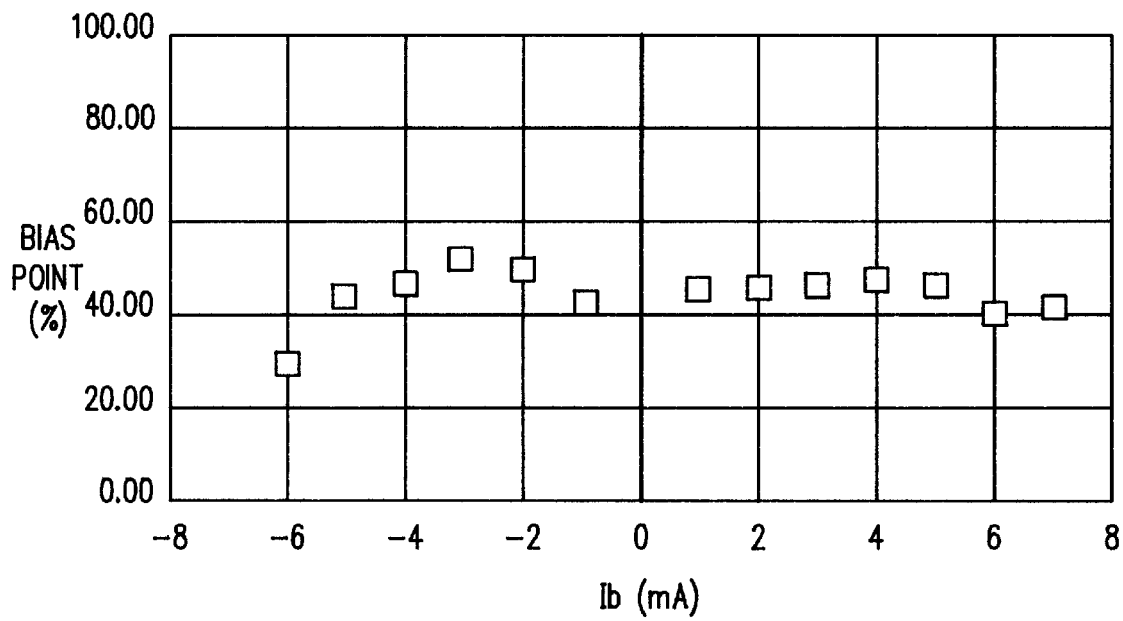
FIGS. 6A and 6B are graphs illustrating the bias point and voltage amplitude versus bias current for a spin valve.
Figure 6B:
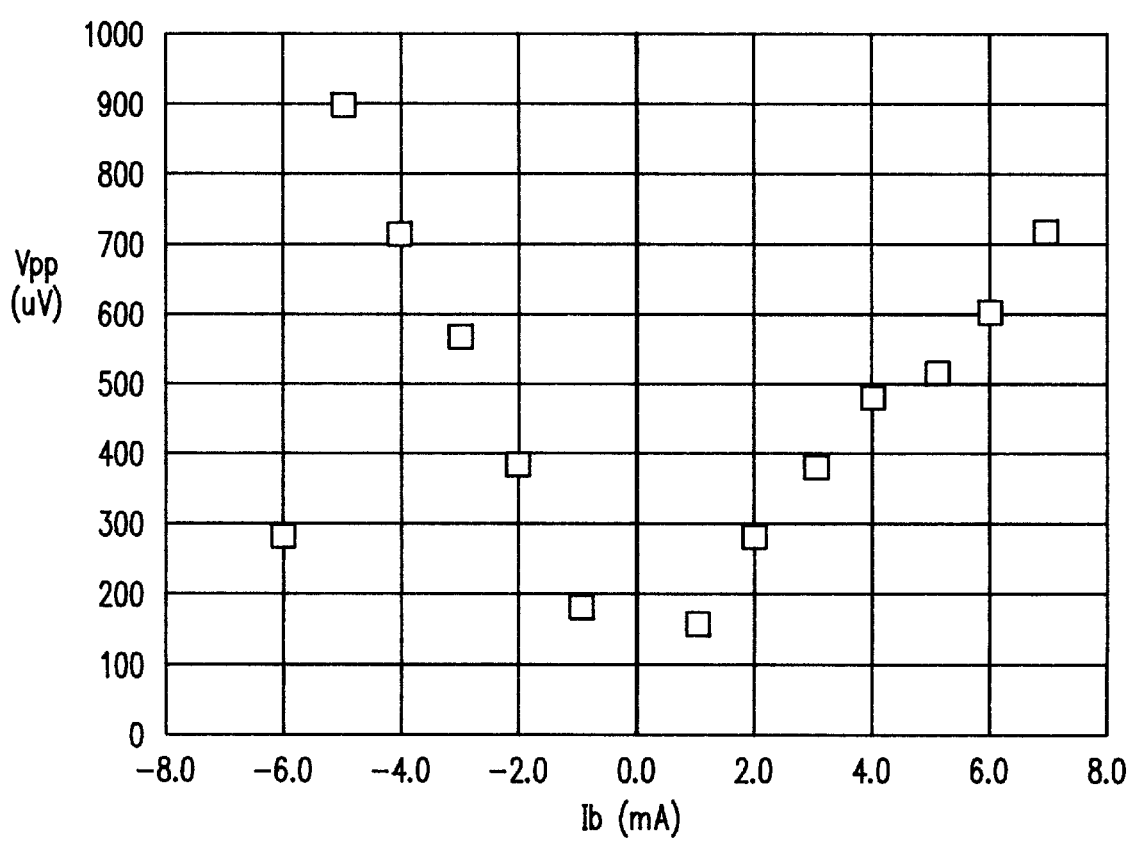

As seen in FIGS. 6A and 6B, when the current through the spin valve sensor reaches $I_b=-6$ mA, a large change in signal amplitude is observed. If the current is further raised to $-7$ mA, the resistance vrs. field curve changes polarity, indicating that the magnetic field of the pinned layer has reversed (not shown). This indicates that, for the particular experimental sensor, a d.c. current of 7 mA raises the temperature of the device above the blocking temperature of the AFM layer to where it does not have any magnetic effect.

However, in this example, when $I_b$ is positive, no particular change in behavior in the bias point and peak-to-peak $V_{pp}$ versus $I_b$ curves is observed around $I_b=+7$ mA. Therefore, at that current level, the magnetic field generated by the bias current saturates the pinned layer, and the AFM no longer has an effect, and can be eliminated. This is achieved because the pinned layer has a very low Mrt, i.e. a small saturation field. With other configurations, an $I_b$ of about 5 mA is sufficient to saturate the pinning layer to create a pinning magnetic field without the need for an AFM layer.

As noted previously, lowering the Mrt by, for example, decreasing the thickness t of the layers, will allow even lower currents $I_b$ to create the desired behavior. For example, bias currents of $I_b=4$ mA will achieve the desired effect when the Mrts of the layers are reduced.

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

What is claimed is:

1. A current-pinned spin valve sensor comprising:
   a soft ferromagnetic free layer having a first thickness and a first Mrt;
   a soft ferromagnetic pinned layer having a second thickness less than said first thickness and a second Mrt substantially less than said first Mrt;
   a copper layer disposed between said free layer and said pinned layer; and
   a current source coupled to said free layer, said pinned layer, and said copper layer to provide a biasing current that generates a magnetic field of sufficient strength to saturate said pinned layer.

2. A current-pinned spin valve sensor as recited in claim 1 wherein said free layer and said pinned layer are selected from a group of materials consisting essentially of Nickel-Iron (NiFe), Cobalt (Co), Iron-Cobalt (CoFe), and soft Cobalt-alloy ferromagnetic alloys.

3. A current-pinned spin valve sensor as recited in claim 1 wherein said free layer has an Mrt of at least 0.3 memu/cm$^2$, and such that the ratio of the Mrt of the free layer to the Mrt of the pinned layer is in the range of 2–10.

4. A current-pinned spin valve sensor as recited in claim 3 wherein said biasing current is at least 4 mA.

5. A current-pinned spin valve sensor as recited in claim 1 wherein said free layer is in the range of 40 to 100 angstroms in thickness, said pinned layer is in the range of 10 to 35 angstroms in thickness, and wherein said copper layer is in the range of 20 to 35 angstroms in thickness.

6. A current-pinned spin valve sensor as recited in claim 1 further comprising a buffer layer abutting said free layer, where said buffer layer is selected from the group consisting essentially of tantalum and zirconium.

7. A current-pinned spin valve sensor as recited in claim 6 further comprising a capping layer abutting said pinned layer, where said capping layer is selected from the group consisting essentially of tantalum and zirconium.

8. A current-pinned spin valve sensor consisting essentially of:
   a soft ferromagnetic free layer having a first thickness and a first Mrt;
   a soft ferromagnetic pinned layer having a second thickness less than said first thickness and a second Mrt substantially less than said first Mrt;
   a copper layer disposed between said free layer and said pinned layer; and
   a current source coupled to said free layer, said pinned layer, and said copper layer to provide a biasing current that generates a magnetic field of sufficient strength to saturate said pinned layer.

9. A current pinned spin valve sensor as recited in claim 8 wherein said free layer and said pinned layer are selected from a group of materials consisting essentially of Nickel-Iron (NiFe), Cobalt (Co), Iron-Cobalt (CoFe), and soft Cobalt-alloy ferromagnetic alloys.

10. A current pinned spin valve sensor as recited in claim 9 wherein said free layer has an Mrt of at least 0.3 memu/cm$^2$ and wherein said pinned layer has an Mrt of at most 0.28 memu/cm$^2$, and such that the ratio of the Mrt of the free layer to the Mrt of the pinned layer is in the range of 2–10.

11. A current pinned spin valve sensor as recited in claim 10 wherein said biasing current is at least 4 mA.

12. A current-pinned spin valve sensor as recited in claim 8 wherein said free layer is in the range of 40 to 100 angstroms in thickness, said pinned layer is in the range of 10 to 35 angstroms in thickness, and wherein said copper layer is in the range of 20 to 35 angstroms in thickness.

13. A current-pinned spin valve sensor as recited in claim 8 further comprising a buffer layer abutting said free layer, where said buffer layer is selected from the group consisting essentially of tantalum and zirconium.

14. A current-pinned spin valve sensor as recited in claim 13 further comprising a capping layer abutting said pinned layer, where said capping layer is selected from the group consisting essentially of tantalum and zirconium.

15. A method for pinning a pinned layer of a spin valve sensor comprising:
   providing a spin valve sensor having a soft ferromagnetic free layer having a first thickness, a soft ferromagnetic pinned layer having a second thickness less than said first thickness, and a copper layer disposed between said free layer and said pinned layer; and
   passing a biasing current through said spin valve sensor to generate a magnetic field of sufficient strength to saturate said pinned layer.

16. A method for pinning a pinned layer of a spin valve sensor as recited in claim 15, wherein said free layer has an Mrt of at least 0.3 memu/cm$^2$ and wherein said pinned layer has an Mrt of at most 0.28 memu/cm$^2$, and such that the ratio of the Mrt of the free layer to the Mrt of the pinned layer is in the range of 2–10.

17. A method for pinning a pinned layer of a spin valve sensor as recited in claim 15, wherein said biasing current is at least 4 mA.

18. A magnetic disk system comprising:

a magnetic disk coupled to a motor for rotation around an axis; and a transducer supported over said magnetic disk, said transducer including a spin valve sensor having a soft ferromagnetic free layer having a first thickness and a first Mrt; a soft ferromagnetic pinned layer having a second thickness less than said first thickness and a second Mrt substantially less than said first Mrt; and a copper layer disposed between said free layer and said pinned layer; and a current source coupled to said spin valve sensor to provide a biasing current that generates a magnetic field of sufficient strength to saturate said pinned layer.

19. A read/write head assembly comprising:

a transducer including an inductive write element and a spin valve sensor having a soft ferromagnetic free layer having a first thickness and a first Mrt; a soft ferromagnetic pinned layer having a second thickness less than said first thickness and a second Mrt substantially less than said first Mrt; and a copper layer disposed between said free layer and said pinned layer;

a current source coupled to said spin valve sensor to provide a biasing current that generates a magnetic field of sufficient strength to saturate said pinned layer; and an elongated suspension arm supporting said transducer proximate to one end thereof.

20. A read/write head assembly as recited in claim 19 wherein said free layer has an Mrt of at least 0.3 memu/cm$^2$ and wherein said pinned layer has an Mrt of at most 0.28 memu/cm$^2$, and such that the ratio of the Mrt of the free layer to the Mrt of the pinned layer is in the range of 2–10.

* * * * *